(12) United States Patent
Hermkens et al.

(10) Patent No.: US 7,172,805 B2
(45) Date of Patent: Feb. 6, 2007

(54) METHOD FOR MANUFACTURING A SEQUENTIAL BACKPLANE

(75) Inventors: Gerald A. J. Hermkens, Echt (NL); Marcel Smeets, Echt (NL); Roger Theelen, Roermond (NL); Peter J. M. Thoolen, Echt (NL); Frank Speetjens, Elsloo (NL)

(73) Assignee: Viasytems Group, Inc., St. Louis, MO (US)

( * ) Notice: Subject to any disclaimer, the term of this patent is extended or adjusted under 35 U.S.C. 154(b) by 0 days.

(21) Appl. No.: 10/887,484

(22) Filed: Jul. 8, 2004
(Under 37 CFR 1.47)

(65) Prior Publication Data
US 2005/0109532 A1 May 26, 2005

Related U.S. Application Data

(60) Provisional application No. 60/485,765, filed on Jul. 8, 2003.

(51) Int. Cl.
*B32B 3/00* (2006.01)
*H01K 1/03* (2006.01)
*H01R 9/09* (2006.01)
(52) U.S. Cl. .................. 428/209; 428/901; 174/250; 174/255; 174/261; 174/262
(58) Field of Classification Search ............. 439/59, 439/61–65, 74–76, 78, 85; 428/209, 901; 174/250, 255, 261–262
See application file for complete search history.

(56) References Cited

U.S. PATENT DOCUMENTS 3,610,811 A * 10/1971 O'Keefe ..................... 174/262
3,756,891 A 9/1973 Ryan
4,030,190 A 6/1977 Varker
4,478,469 A * 10/1984 Waite et al. .................. 439/64

(Continued)

FOREIGN PATENT DOCUMENTS

EP 0438012 A2 7/1991

(Continued)

Primary Examiner—Cathy F. Lam
(74) Attorney, Agent, or Firm—Dunlap, Codding & Rogers, P.C.

(57) ABSTRACT

A method for manufacturing a mid-plane. a multi-layer board having a connection assembly is provided and a dielectric layer with a channel formed therein to define a perimeter of a connector area is provided. The dielectric layer is bonded to the multi-layer board such that the connector area overlaps the part of the connection assembly of the multi-layer board. At least a portion of the connector area in the dielectric layer is removed to expose the connection assembly of the multi-layer board. A rigid multilayer is also disclosed. The rigid multilayer includes a multi-layer board and a dielectric layer. The multi-layer board has a connection assembly. The dielectric layer has a channel formed therein to define a perimeter of a connector area. The dielectric layer is bonded to the multi-layer board such that the connector area overlaps the connection assembly of the multi-layer board. The connector area can then be removed such as by depth controlled routing. As will be understood by one skilled in the art, the depth tolerance is not critical because the dielectric layer is pre-formed with the channel prior to formation of the rigid multi-layer.

3 Claims, 6 Drawing Sheets

U.S. PATENT DOCUMENTS

| | | |
|---|---|---|
| 4,686,607 A | 8/1987 | Johnson |
| 4,943,334 A | 7/1990 | Medney et al. |
| 5,199,879 A * | 4/1993 | Kohn et al. ............... 439/63 |
| 5,376,326 A | 12/1994 | Medney et al. |
| 5,400,220 A | 3/1995 | Swamy et al. |
| 5,592,737 A | 1/1997 | Middelman et al. |
| 5,633,072 A | 5/1997 | Middelman et al. |
| 5,690,270 A * | 11/1997 | Gore ................ 228/180.22 |
| 5,826,329 A | 10/1998 | Roth |
| 5,869,356 A | 2/1999 | Fuller, Jr. et al. |
| 5,904,581 A | 5/1999 | Pope et al. |
| 6,016,598 A | 1/2000 | Middelman et al. |
| 6,135,781 A | 10/2000 | Pope et al. |
| 6,174,562 B1 * | 1/2001 | Bergstedt ................ 430/314 |
| 6,201,305 B1 * | 3/2001 | Darveaux et al. ......... 257/779 |
| 6,456,498 B1 | 9/2002 | Larsen et al. |
| 6,528,737 B1 | 3/2003 | Kwong et al. |
| 6,535,397 B2 | 3/2003 | Clark et al. |
| 6,538,899 B1 | 3/2003 | Krishnamurthi et al. |
| 6,564,450 B2 * | 5/2003 | Engbring et al. ............ 29/830 |
| 2002/0181217 A1 | 12/2002 | Patriche |
| 2004/0108137 A1 | 6/2004 | Vetter et al. |

FOREIGN PATENT DOCUMENTS

| | | |
|---|---|---|
| EP | 0438012 A3 | 7/1991 |
| GB | 2101411 A | 1/1983 |

* cited by examiner

METHOD FOR MANUFACTURING A SEQUENTIAL BACKPLANE

CROSS-REFERENCE TO RELATED APPLICATIONS

The present patent application claims priority to the provisional patent application filed on Jul. 8, 2003 and identified by U.S. Ser. No. 60/485,765, the entire content of which is hereby incorporated herein by reference.

STATEMENT REGARDING FEDERALLY SPONSORED RESEARCH OR DEVELOPMENT

Not Applicable.

SUMMARY OF THE INVENTION

In general, the present invention relates to method for manufacturing a mid-plane. In the method, a multi-layer board and a dielectric layer are provided. The multi-layer board has a connection assembly. The dielectric layer has a channel formed therein to define a perimeter of a connector area. The dielectric layer is bonded to the multi-layer board such that the connector area overlaps the connection assembly of the multi-layer board. Then, at least a portion of the connector area in the dielectric layer is removed to expose the connection assembly of the multi-layer board.

The present invention also relates to a rigid multilayer. The rigid multilayer includes a multi-layer board and a dielectric layer. The multi-layer board has a connection assembly. The dielectric layer has a channel formed therein to define a perimeter of a connector area. The dielectric layer is bonded to the multi-layer board such that the connector area overlaps the connection assembly of the multi-layer board. The connector area can then be removed such as by depth controlled routing to expose the connection assembly of the multi-layer board. As will be understood by one skilled in the art, the depth tolerance is not critical because the dielectric layer is pre-formed with the channel prior to formation of the rigid multi-layer.

The dielectric layer is preferably bonded to the multi-layer board with a flowable adhesive, such as pre-preg. The channel pre-formed in the dielectric layer prevents the flowable adhesive from entering the connector area. Thus, the flowable adhesive does not interfere with or otherwise damage the connection assembly formed in the multi-layer board.

Other advantages and features of the present invention will become apparent to one skilled in the art when the following detailed description is read in conjunction with the attached drawings and the appended claims.

DETAILED DESCRIPTION OF THE INVENTION

Figure 1:
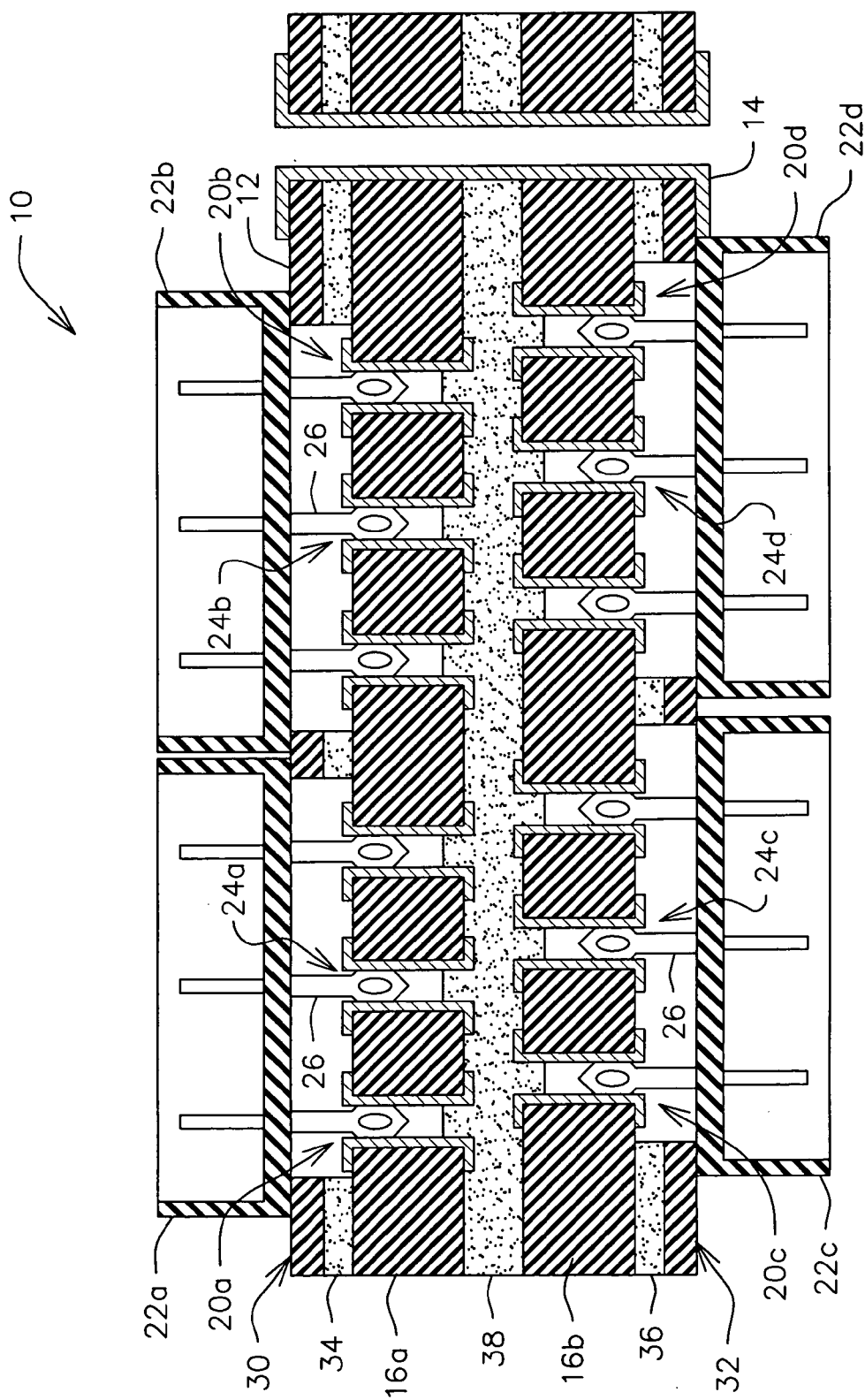
FIG. 1 is a cross-sectional view of a mid-plane constructed in accordance with the present invention.

Referring to the drawings, and in particular to FIG. 1, shown therein and designated by a reference numeral 10 is a mid-plane constructed in accordance with the present invention. The mid-plane 10 is provided with a first side 12 and a second side 14. The mid-plane 10 is also provided with at least two multi-layer boards 16, which are designated by the reference numeral 16a and 16b for purposes of clarity. Each of the multi-layer boards 16 defines at least one and preferably more than one connector area 20. The connector areas 20 are designated for purposes of clarity by the referenced numerals 20a, 20b, 20c and 20d. The connector areas 20a and 20b are positioned adjacent to the first side 12. The connector areas 20c and 20d are positioned adjacent to the second side 14. As will be discussed in more detail below, the connector areas 20 are designed to permit interconnection with connectors 22 such that the connectors 22 can be mounted on both sides, i.e., the first side 12 and the second side 14, of the mid-plane 10. The connectors 22 are designated for purposes of clarity with the reference numerals 22a, 22b, 22c, and 22d. The connectors 22 are connected to the multi-layer boards 16 by any suitable connection assembly 24, which is illustrated in FIG. 1 by way of press fit connectors 26 by way of example. Only three of the press fit connectors 26 are labeled in FIG. 1 for purposes of clarity.

The mid-plane 10 is also provided with first and second metallic foils 30 and 32. The first metallic foil 30 is connected to the multi-layer board 16a via a bonding material 34. The second metallic foil 32 is connected to the multi-layer board 16b via a bonding material 36. The multi-layer board 16a is connected to the multi-layer board 16b by way of a bonding material 38. The bonding materials 34, 36 and 38 can be any suitable material capable of rigidly affixing the metallic foils 30 and 32, and the multi-layer boards 16a and 16b together to form the mid-plane 10 as a rigid structure. For example, the bonding materials 34, 36 and 38 can be an uncured pre-preg material.

It should be noted that the first and second metallic foils 30 and 32 can be provided with predetermined conductive patterns thereon including vias or other types of electrical interconnections for connecting the first and second metallic foils 30 and 32 to the respective multi-layer boards 16a and 16b so that at least two independent circuits are formed on either side of the mid-plane 10. In other words, the first metallic foil 30 is electrically interconnected with the multi-layer board 16a to form at least one independent circuit. Likewise, the second metallic foil 32 is interconnected with the multi-layer board 16b to form at least one independent circuit. It should be noted that the circuits on the multi-layer boards 16a and 16b can be interconnected, if desired, by vias or other suitable conductive paths formed in the mid-plane 10.

FIGS. 2–5 illustrate one method for forming the mid-plane 10. FIGS. 2–5 will now be described in more detail. However, it should be understood that other manners in constructing the mid-plane 10 can be used.

Figure 2:
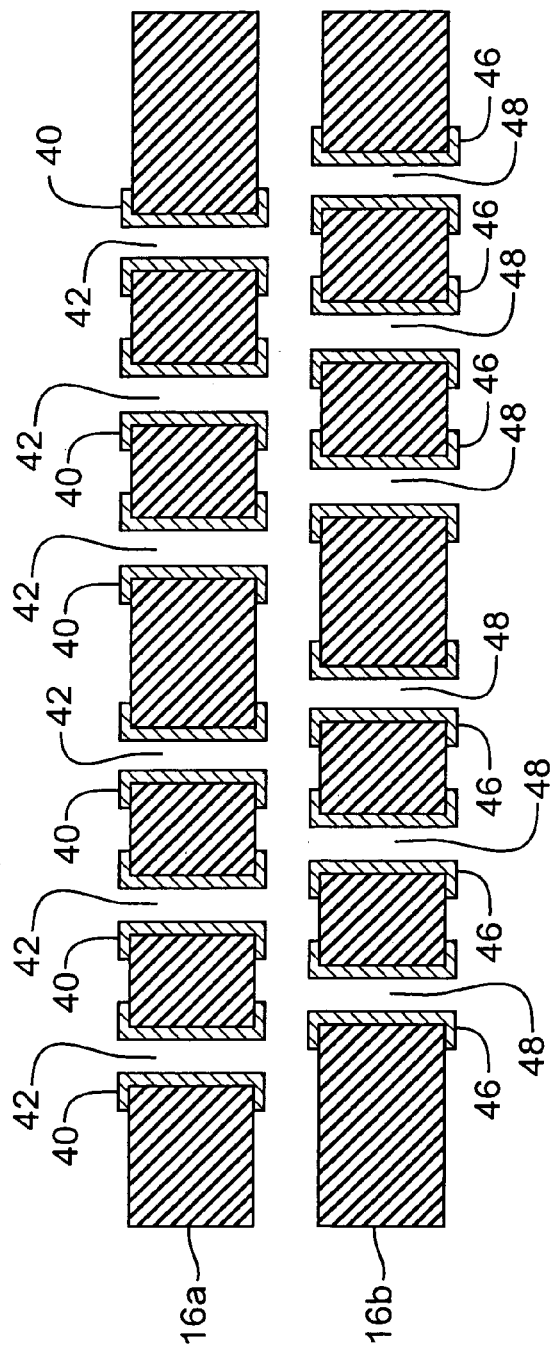
FIG. 2 is a cross-sectional view of two multi-layer circuit boards constructed in accordance with the present invention.

Shown in FIG. 2 are the multi-layer boards 16a and 16b. The connection assembly 24 of the multi-layer board 16a includes a plurality of electrical connectors 40 defining a plurality of holes 42. Likewise, the connection assembly 24 of the multi-layer board 16b is provided with a plurality of electrical connectors 46 defining a plurality of holes 48. The electrical connectors 40 and 46 are sized so that the holes 42 and 48 will matingly receive the press fit connectors 26. The electrical connectors 40 and 46 form a part of the connection assembly 24 referred to above in the preferred embodiment shown herein. The sizes of the holes 42 and 48 are preferably equal to the pressfit sizes.

The multi-layer boards 16a and 16b can be characterized as buried via products complete with a surface finish (not shown) such as an ENIG finish.

Figure 3:
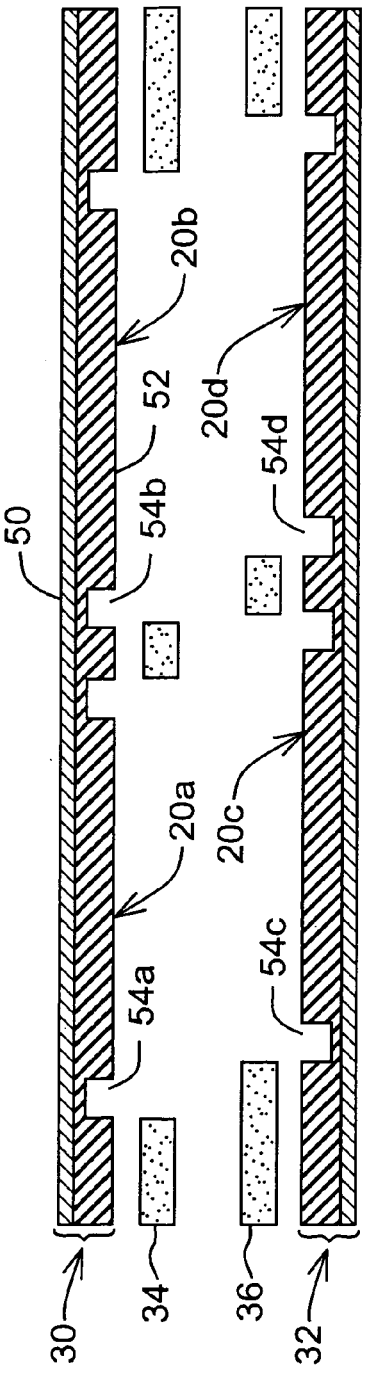
FIG. 3 is a cross-sectional view of a first and second metallic foils and bonding materials utilized in the construction of the mid-plane depicted in FIG. 1.

Shown in FIG. 3 is the first and second metallic foils 30 and 32, as well as the bonding materials 34 and 36. The first and second metallic foils 30 and 32 are substantially identical in construction and function. For purposes of brevity, only the first metallic foil 30 will be described in detail hereinafter. The first metallic foil 30 is provided with a conductive layer 50, and a dielectric layer 52. The conductive layer 50 is constructed of any type of suitable conductive material, such as aluminum, copper or the like. Typically, the conductive layer 50 will be constructed of copper. The conductive layer 50 is etched or otherwise formed into the shape of a predetermined pattern for electrically connecting a variety of components and/or circuits provided in the multi-layer board 16a. The dielectric layer 52 can be constructed of any suitable type of dielectric material, such as FR4. The connector areas 20 are defined in the dielectric layer 52 by creating a channel 54 about a perimeter of a connector area 20. The channel 54 is designated in FIG. 3 by the reference numerals 54a, 54b, 54c and 54d for purposes of clarity. The channels 54a, 54b, 54c and 54d serve at least two purposes. The first purpose is to prevent the bonding materials 34 and 36 from bleeding or flowing into the connector areas 20a, 20b, 20c and 20d. The other purpose is to permit removal of the first and second metallic foils 30 and 32 in the connector areas 20a, 20b, 20c and 20d in a subsequent manufacturing step, which will be discussed in more detail in FIG. 7. The channels 54a, 54b, 54c, and 54d can be formed in any suitable manner, such as with a router or a laser.

The bonding materials 34 and 36 are provided adjacent to the dielectric layer 52 and extend generally about the dielectric layer 52, with the exception of the portions of the dielectric layer 52 provided in the connector areas 20a, 20b, 20c and 20d.

Figure 4:
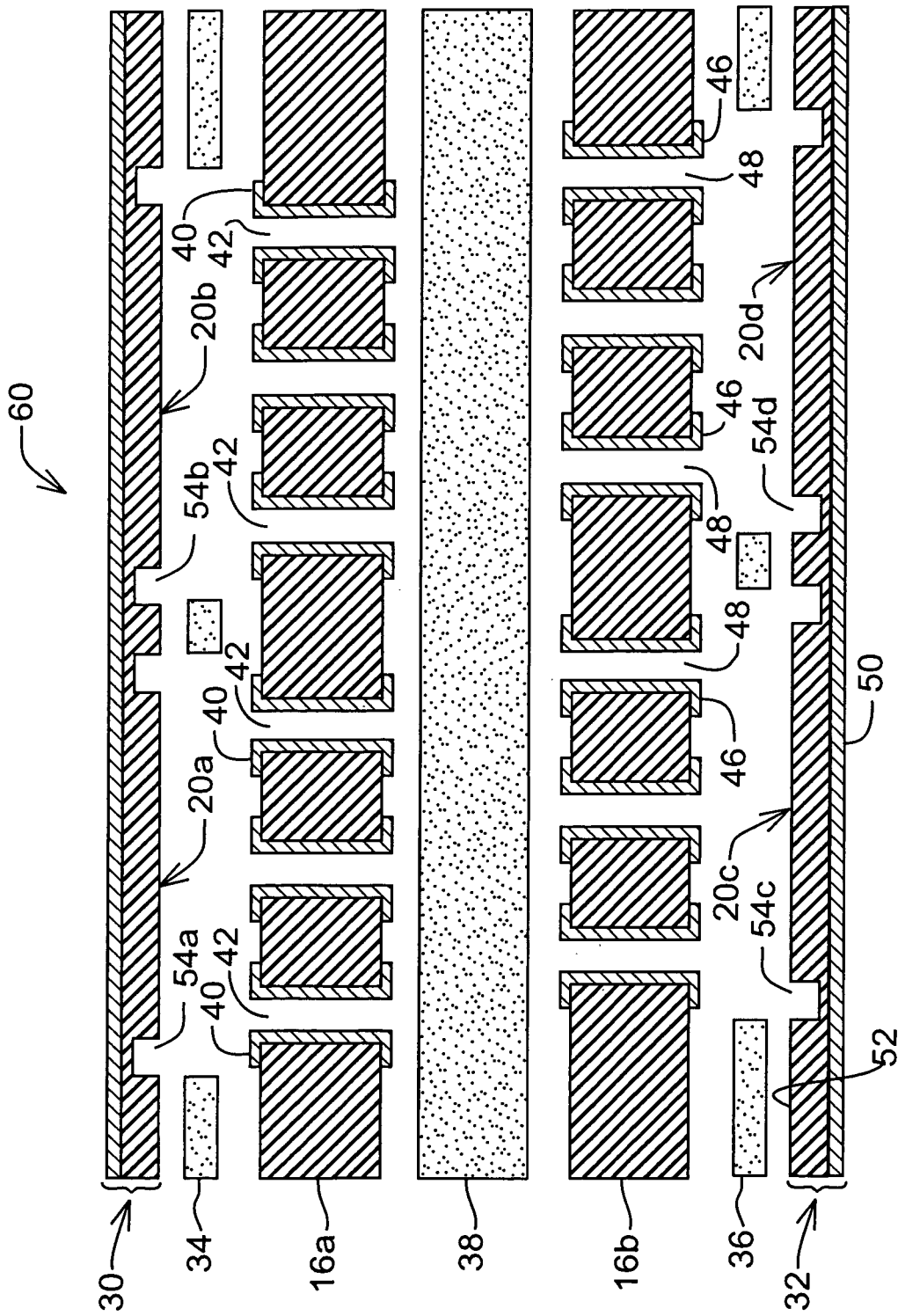
FIG. 4 is a cross-sectional view of a laminate stack formed of the multi-layer boards depicted in FIG. 2, combined with the metallic foils and bonding materials depicted in FIG. 3.
Figure 5:
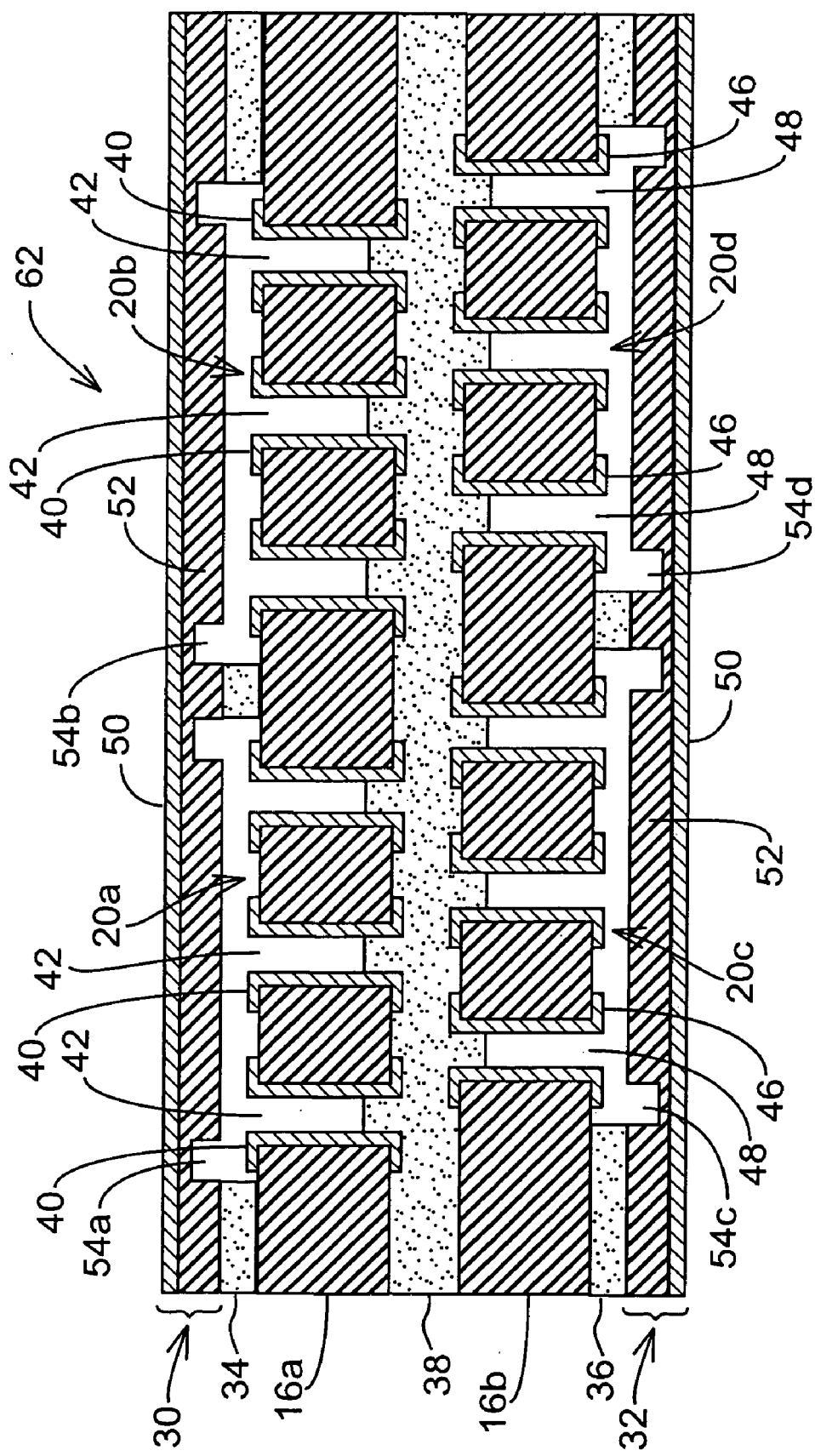
FIG. 5 is a cross-sectional view of the laminate stack depicted in FIG. 4, laminated together to form a rigid multi-layer product ready for finishing.

Shown in FIG. 4 is a laminate stack 60 formed of the multi-layer boards 16a and 16b, first and second metallic foils 30 and 32, and bonding materials 34, 36 and 38. The laminate stack 60 is then subjected to conditions which causes the bonding materials 34, 36 and 38 to bond the first and second metallic foils 30 and 32, and the multi-layer boards 16a and 16b together, substantially as shown in FIG. 5. For example, when the bonding materials 34, 36 and 38 are constructed of pre-preg, the laminate stack 60 is subjected to heat and pressure to form a rigid multi-layer 62 suitable for finishing.

Figure 6:
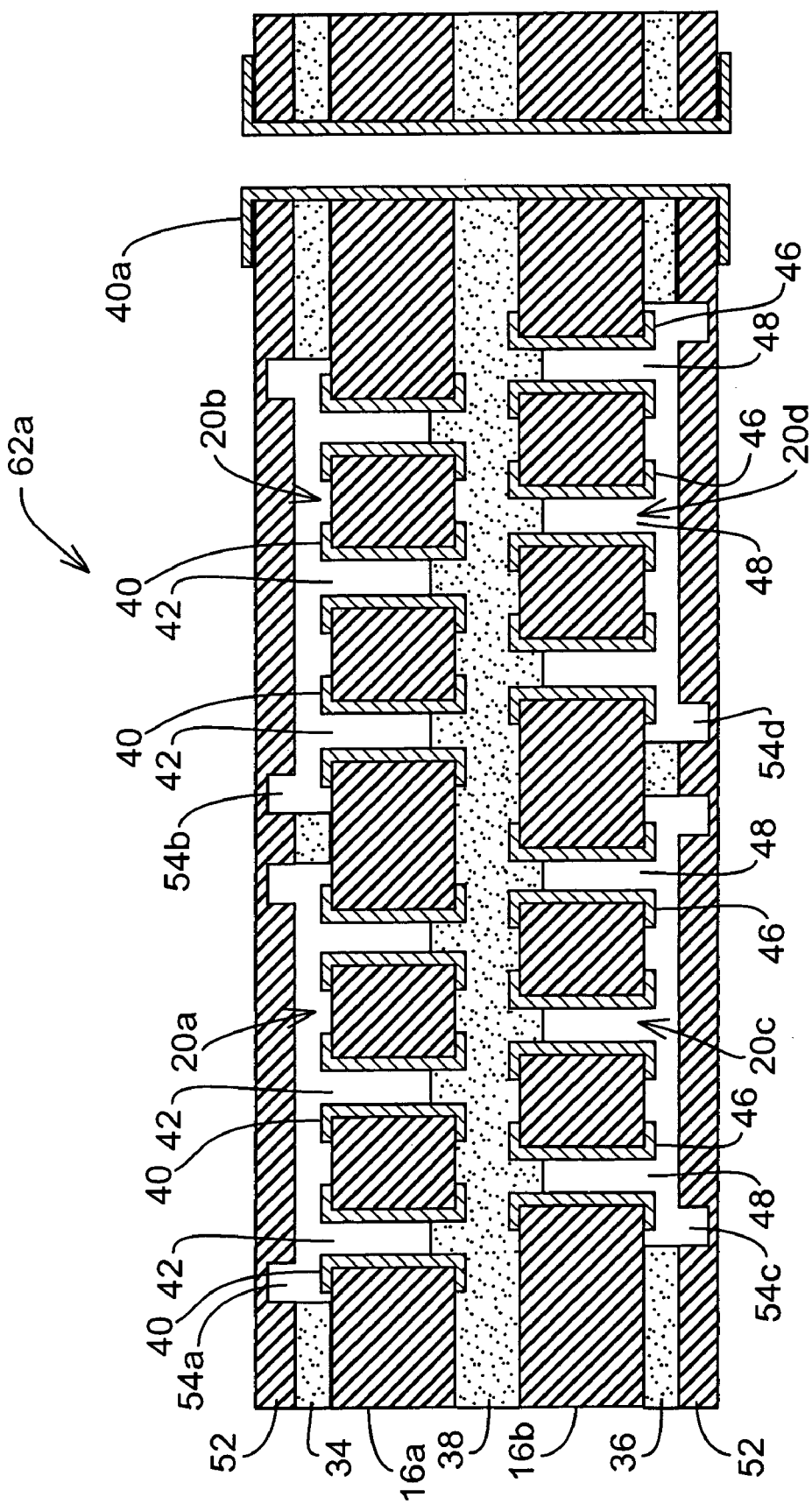
FIG. 6 is a cross-sectional view of another embodiment of a laminate stack, which is similar to FIG. 5 with the exception that the conductive layer has been removed and an electrical connector has been added.

In another embodiment a rigid multi-layer 62a can be produced, as shown in FIG. 6. The rigid multi-layer 62a is similar to the rigid multi-layer 62 except the conductive layer 50 has been removed and an electrical connector 40a has been added. The rigid multi-layer 62a is ready to be finished as standard. For example, drilling, plating, pattern outerlayers and surface finish may be utilized to finish the rigid multi-layer 62a.

Figure 7:
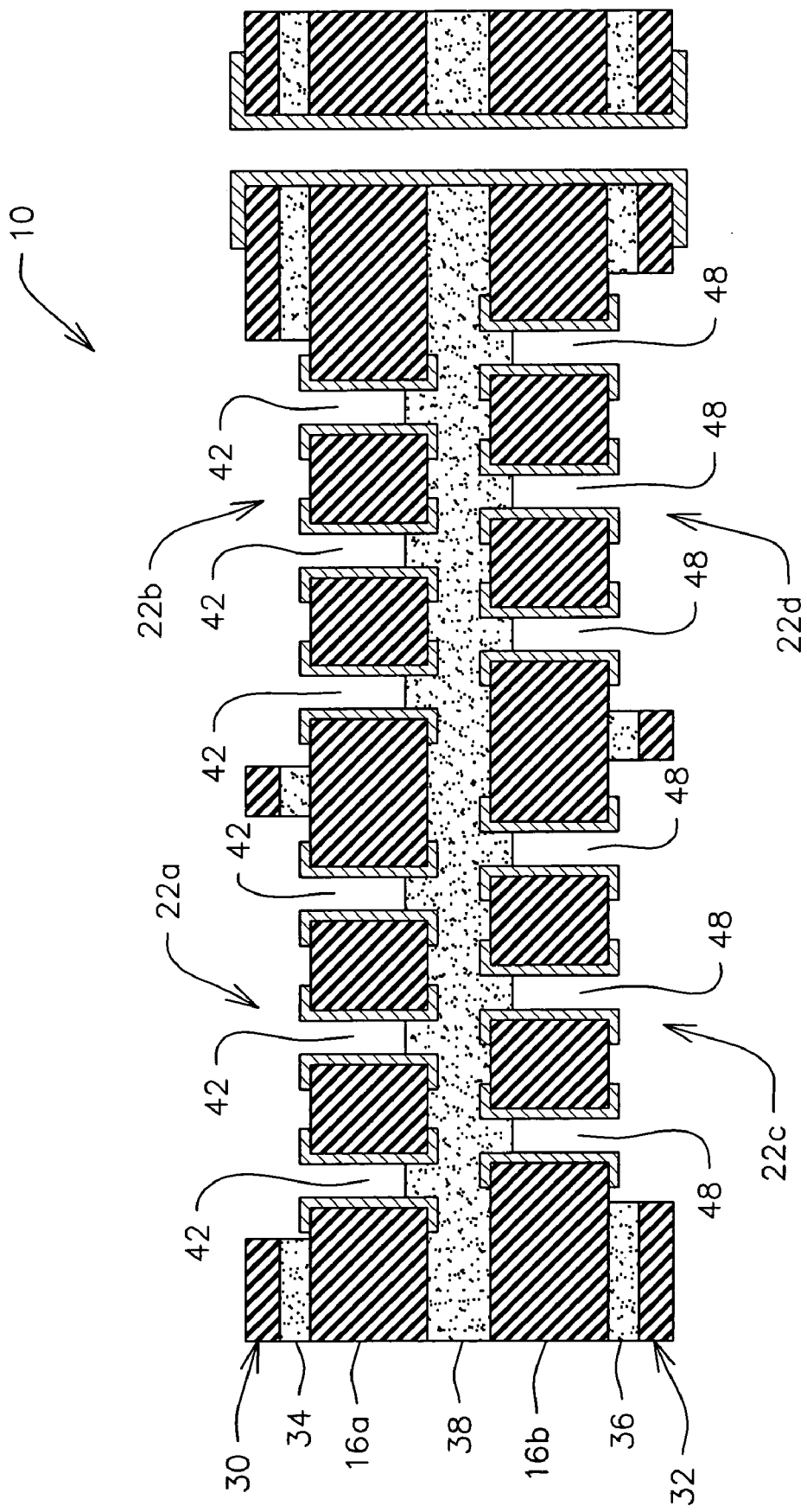
FIG. 7 is a cross-sectional view of the finished mid-plane.

As shown in FIG. 7, the rigid multi-layer 62 can be profiled in a well known manner, but first, the connector areas 22a, 22b, 22c are opened to permit insertion of the connectors 22a–b by cutting or removing materials adjacent to the channels 54a–d. As will be understood by one skilled in the art, the depth tolerance is not critical because the first and second metallic foils 30 and 32 are pre-formed with the channels 54a–d prior to formation of the rigid multi-layer 62. In one embodiment, the connector areas 22a–d are opened by using depth control routing of the cambers.

The mid plane 10 can then be used in a well known manner. That is, the connectors 22 with the press fit connectors 26 are connected through the rigid multi-layer by inserting the press fit connectors 26 in through the holes 42 and 48 in the rigid multi-layer 62. The use of mid planes is known in the art, and no more comments are believed necessary to teach one skilled in the art how to use the mid plane 10 in view of the other detailed description contained herein.

It should be understood that the foregoing sets forth examples of the present invetion. Thus, changes may be made in the construction and operation of the various components, elements and assemblies described herein and changes may be made in the steps or the sequence of steps of the methods described hereinwithout departing from the spirit and the scope of the invention as defined in the following claims.

What is claimed is:

1. A rigid multilayer product, comprising:
   a multi-layer board having a connection assembly defining a connector area having a perimeter, the multi-layer board having an exterior surface; and
   a dielectric layer having a first side and a second side, the first side of the dielectric layer bonded to the exterior surface of the multi-layer board, a channel extending laterally in the dielectric layer and extending about the perimeter of the connector area of the multi-layer board, the channel formed in the first side of the dielectric layer, wherein the dielectric layer is spaced a distance from the multi-layer board adjacent to the connector area of the multi-layer board.

2. The rigid multilayer of claim 1, further comprising a conductive layer extending over the dielectric layer such that the dielectric layer is positioned between the conductive layer and the multi-layer board.

3. A rigid multilayer product, comprising:
   a multi-layer board having a connection assembly defining a perimeter, and the multi-layer board having an exterior surface; and
   a dielectric layer bonded to the exterior surface of the multi-layer board and overlaying the connection assembly of the multi-layer board, the dielectric layer defining a channel extending laterally between the multi-layer board and the dielectric layer to separate a portion of the dielectric layer from the multi-layer board, the channel extending about the perimeter of the connection assembly of the multi-layer board, wherein the dielectric layer is spaced a distance from the connection assembly of the multi-layer board.

* * * * *